United States Patent
Wu et al.

(10) Patent No.: US 9,063,419 B2
(45) Date of Patent: Jun. 23, 2015

(54) PHOTO-CURING POLYSILOXANE COMPOSITION AND APPLICATION THEREOF

(71) Applicant: Chi Mei Corporation, Tainan (TW)

(72) Inventors: Ming-Ju Wu, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 133 days.

(21) Appl. No.: 13/860,771

(22) Filed: Apr. 11, 2013

(65) Prior Publication Data

US 2013/0280541 A1  Oct. 24, 2013

(30) Foreign Application Priority Data

Apr. 23, 2012 (TW) .............................. 101114363 A

(51) Int. Cl.
| | | |
|---|---|---|
| G03F 7/039 | (2006.01) | |
| G03F 7/022 | (2006.01) | |
| G03F 7/023 | (2006.01) | |
| G03F 7/038 | (2006.01) | |
| G03F 7/075 | (2006.01) | |

(52) U.S. Cl.
CPC .......... *G03F 7/039* (2013.01); *Y10T 428/31663* (2015.04); *G03F 7/0226* (2013.01); *G03F 7/0233* (2013.01); *G03F 7/038* (2013.01); *G03F 7/0757* (2013.01)

(58) Field of Classification Search
CPC ..... G03F 7/039; G03F 7/0226; G03F 7/0233; G03F 7/038; G03F 7/0757
USPC ............................................. 524/99; 428/447
See application file for complete search history.

(56) References Cited

U.S. PATENT DOCUMENTS

| | | |
|---|---|---|
| 6,534,235 B1 | 3/2003 | Hanabata et al. |
| 7,115,673 B2 | 10/2006 | Mochizuki et al. |
| 7,598,009 B2 | 10/2009 | Sato et al. |
| 2009/0197986 A1 | 8/2009 | Lee et al. |
| 2010/0102321 A1* | 4/2010 | Abe et al. ........................ 257/59 |
| 2011/0309507 A1 | 12/2011 | Darnon et al. |

FOREIGN PATENT DOCUMENTS

| | | |
|---|---|---|
| JP | H5-164903 | 6/1993 |
| JP | H7-333840 | 12/1995 |
| JP | 2003-315998 | 11/2003 |
| JP | 2004-315744 | 11/2004 |
| JP | 2006-276598 | 10/2006 |
| JP | 2007-017481 | 1/2007 |
| JP | 2008-107529 A | 5/2008 |
| TW | 2009-12544 | 3/2009 |

* cited by examiner

*Primary Examiner* — Kriellion Sanders
(74) *Attorney, Agent, or Firm* — Robert J. Sacco, Esq.; Fox Rothschild LLP

(57) ABSTRACT

Disclosed is a photosensitive polysiloxane composition including:
- a polysiloxane;
- a quinonediazidesulfonic acid ester;
- a pyridine derivative of Formula (II)

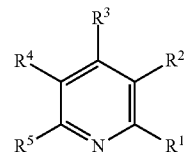

(II)

wherein
one to three of $R^1$-$R^5$ independently represent a hydroxyl-substituted $C_1$-$C_6$ alkyl group, and the rest of $R_1$-$R_5$ independently represent hydrogen or a $C_1$-$C_6$ alkyl group; and
a solvent.

5 Claims, No Drawings

PHOTO-CURING POLYSILOXANE COMPOSITION AND APPLICATION THEREOF

CROSS-REFERENCE TO RELATED APPLICATION

This application claims priority of Taiwanese Application No. 101114363, filed on Apr. 23, 2012.

BACKGROUND OF THE INVENTION

1. Field of the Invention

This invention relates to a photosensitive polysiloxane composition, more particularly to a positive photosensitive polysiloxane composition including a polysiloxane and a pyridine derivative. This invention also relates to a protective film formed from the photosensitive polysiloxane composition, and an element containing the protective film.

2. Description of the Related Art

In recent years, in the field of semiconductor industry, liquid crystal displays, and organic electroluminescence displays, it is required that the pattern details in photolithography process be higher due to element miniaturization.

Positive type photosensitive materials with high resolution and high sensitivity are adopted to obtain miniaturized patterns via exposure and development. The positive type photosensitive material containing a polysiloxane composition has been widely used in the art.

JP 7-333840 discloses a positive-working photoresist composition including a cresol novolac resin as the film-forming agent and a quinonediazido group-containing compound as the photosensitizing agent. The positive-working photoresist composition is admixed with a limited amount of a hydroxyalkyl-substituted pyridine compound so as to greatly improve the adhesive bonding of the resist layer to the substrate surface. However, the photoresist after developing is colored due to the cresol novolac resin composition. This colored film is undesirable when the photoresist is used as part of the element and is required to be transparent.

JP 2008-107529 discloses a photosensitive resin composition capable of forming a cured film. The photosensitive resin composition includes a polysiloxane, a quinonediazidesulfonic acid ester, and a solvent. The polysiloxane contains an oxetanyl group or a succinic anhydride group, and is obtained by subjecting a silane monomer containing an oxetanyl group or a succinic anhydride group to hydrolysis and partial condensation. The polysiloxane is formed with a hydrophilic structure via a ring-opening reaction during copolymerization, and has high solubility in a dilute base developer. Nevertheless, the development resistance of the photosensitive resin composition is unacceptable in the art.

It is still required in the art to provide a photosensitive resin composition which can be used to form a protective film having superior development resistance.

SUMMARY OF THE INVENTION

A first object of this invention is to provide a photosensitive polysiloxane composition having high sensitivity.

A second object of this invention is to provide a protective film having superior development resistance.

A third object of this invention is to provide an element having the protective film.

According to a first aspect of this invention, there is provided a photosensitive polysiloxane composition including a polysiloxane, a quinonediazidesulfonic acid ester, a pyridine derivative of Formula (II), and a solvent,

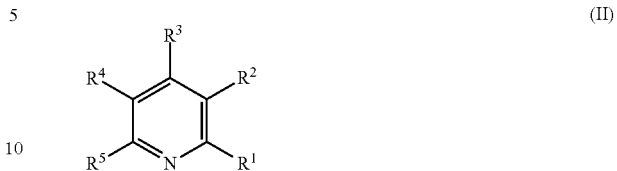

wherein
one to three of $R^1$-$R^5$ independently represents a hydroxyl-substituted $C_1$-$C_6$ alkyl group, and the rest of $R_1$-$R_5$ independently represents hydrogen or a $C_1$-$C_6$ alkyl group.

According to a second aspect of this invention, there is provided a protective film formed by applying the photosensitive polysiloxane composition on a substrate.

According to a third aspect of this invention, there is provided an element including the protective film applied on the substrate.

A protective film having superior development resistance can be formed using the photosensitive polysiloxane composition of the present invention in which the polysiloxane and the pyridine derivative of formula (II) are both included.

DETAILED DESCRIPTION OF THE PREFERRED EMBODIMENTS

A photosensitive polysiloxane composition of the present invention includes a polysiloxane (A), a quinonediazidesulfonic acid ester (B), a pyridine derivative (C) of Formula (II), and a solvent (D),

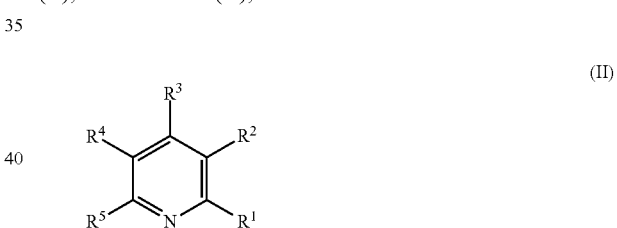

wherein
one to three of $R^1$-$R^5$ independently represents a hydroxyl-substituted $C_1$-$C_6$ alkyl group, and the rest of $R_1$-$R_5$ independently represents hydrogen or a $C_1$-$C_6$ alkyl group.

The polysiloxane (A), the quinonediazidesulfonic acid ester (B), the pyridine derivative (C), and the solvent (D) will be described in detail in the following paragraphs.

Polysiloxane (A):

There is no specific limitation to the polysiloxane (A) as long as the purpose of this invention is served. Preferably, the polysiloxane (A) is obtained by subjecting a silane monomer component to hydrolysis and partial condensation. The silane monomer component includes a silane monomer of formula (I):

$$Si(R^a)_t(OR^b)_{4-t} \quad (I)$$

wherein
t is an integer ranging from 1 to 3,
at least one of $R^a$ is selected from the group consisting of an anhydride-substituted $C_1$-$C_{10}$ alkyl group, an epoxy-substituted $C_1$-$C_{10}$ alkyl group, and an epoxy-substituted alkoxy group, and the rest of $R^a$ is selected from the group consisting of hydrogen, a $C_1$-$C_{10}$ alkyl group, a $C_2$-$C_{10}$ alkenyl group, and a $C_6$-$C_{15}$ aryl group, plural $R^a$s can be identical with or different from each other when t is 2 or 3, and $R^b$ is selected from the group consisting of a hydrogen atom, a $C_1$-$C_6$ alkyl group, a $C_1$-$C_6$ acyl group, and a $C_6$-$C_{15}$ aryl group, $R^b$s can be identical with or different from each other when 4-t is 2 or 3.

The polysiloxane (A) included in the photosensitive polysiloxane composition of the present invention contains an anhydride group or/and an epoxy group. Therefore, the exposure energy and period for the exposure process can be reduced, and the sensitivity of the photosensitive polysiloxane composition can be enhanced. Acidic groups can be effectively produced so as to benefit the subsequent development process.

Examples of the anhydride-substituted $C_1$-$C_{10}$ alkyl group include, but are not limited to, ethyl succinic anhydride, propyl succinic anhydride, and propyl glutaric anhydride.

Examples of the epoxy-substituted $C_1$-$C_{10}$ alkyl group include, but are not limited to, oxetanylpentyl, and 2-(3,4-epoxycyclohexyl)ethyl.

Examples of the epoxy-substituted alkoxy group include, but are not limited to, glycidoxypropyl, and 2-oxetanylbutoxy.

In the definition of $R^b$, examples of the $C_1$-$C_6$ alkyl group include, but are not limited to, methyl, ethyl, n-propyl, isopropyl, and n-butyl. A non-limiting example of the $C_1$-$C_6$ acyl group is acetyl. A non-limiting example of the $C_6$-$C_{15}$ aryl group is phenyl.

Examples of the silane monomer represented by Formula (I) include, but are not limited to, 3-glycidoxypropyltrimethoxysilane (abbreviated as TMS-GAA), 3-glycidoxypropyltriethoxysilane, 2-(3,4-epoxycyclohexyl)ethyltrimethoxysilane, and 2-oxetanylbutoxypropyltriphenoxysilane; commercially available products manufactured by Toagosei Co., Ltd., for example, 2-oxetanylbutoxypropyltrimethoxysilane (trade name: TMSOX-D), 2-oxetanylbutoxypropyltriethoxysilane (trade name: TESOX-D), and 3-triphenoxysilyl propyl succinic anhydride; commercially available products manufactured by Shin-Etsu Chemical Co., Ltd., for example, 3-trimethoxysilyl propyl succinic anhydride (trade name: X-12-967); commercially available products manufactured by Wacker Chemie AG, for example, 3-(triethoxysilyl) propyl succinic anhydride (trade name: GF-20), 3-(trimethoxysilyl) propyl glutaric anhydride (abbreviated as TMSG), 3-(triethoxysilyl) propyl glutaric anhydride, 3-(triphenoxysilyl) propyl glutaric anhydride, diisopropoxy-di(2-oxetanylbutoxypropyl)silane (abbreviated as DIDOS), di(3-oxetanylpentyl)dimethoxy silane, (di-n-butoxysilyl) di(propyl succinic anhydride), (dimethoxysilyl) di(ethyl succinic anhydride), 3-glycidoxypropyldimethylmethoxysilane, 3-glycidoxypropyldimethylethoxysilane, di(2-oxetanylbutoxypentyl)-2-oxetanylpentylethoxysilane, tri(2-oxetanylpentyl)methoxy silane, (phenoxysilyl) tri(propyl succinic anhydride), and (methylmethoxysilyl) di(ethyl succinic anhydride).

The aforesaid examples of the silane monomer represented by Formula (I) can be used alone or as a mixture of two or more.

Preferably, the silane monomer component also includes a silane monomer represented by Formula (I-1):

$$Si(R^c)_u(OR^d)_{4-u} \tag{I-1}$$

wherein u is an integer ranging from 0 to 3;

$R^c$ represents a hydrogen atom, a $C_1$-$C_{10}$ alkyl group, a $C_2$-$C_{10}$ alkenyl group, or a $C_6$-$C_{15}$ aryl group, plural $R^c$s being identical with or different from each other when u is 2 or 3;

and $R^d$ represents a hydrogen atom, a $C_1$-$C_6$ alkyl group, a $C_1$-$C_6$ acyl group, or a $C_6$-$C_{15}$ aryl group, plural $R^d$s being identical with or different from each other when 4-u is 2, 3 or 4.

In the definition of $R^c$, examples of the $C_1$-$C_{10}$ alkyl group include, but are not limited to, methyl, ethyl, n-propyl, isopropyl, n-butyl, tert-butyl, n-hexyl, n-decyl, trifluoromethyl, 3,3,3-trifluoropropyl, 3-aminopropyl, 3-mercaptopropyl, and 3-isocyanatopropyl. Examples of the $C_2$-$C_{10}$ alkenyl group include, but are not limited to, vinyl, 3-acryloxypropyl, and 3-methacryloxypropyl. Examples of the $C_6$-$C_{15}$ aryl group include, but are not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy)pentyl, and naphthyl.

In the definition of $R^d$, examples of the $C_1$-$C_6$ alkyl group include, but are not limited to, methyl, ethyl, n-propyl, isopropyl, and n-butyl. A non-limiting example of the $C_1$-$C_6$ acyl group is acetyl. A non-limiting example of the $C_6$-$C_{15}$ aryl group is phenyl.

Examples of the silane monomer represented by formula (I-1) include, but are not limited to, tetramethoxysilane, tetraethoxysilane, tetraacetoxysilane, tetraphenoxy silane, methyltrimethoxysilane (abbreviated as MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, phenyltrimethoxysilane (abbreviated as PTMS), phenyltriethoxysilane (abbreviated as PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy) pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, dimethyldimethoxysilane (abbreviated as DMDMS), dimethyldiethoxysilane, dimethyldiacetyloxysilane, di-n-butyldimethoxysilane, diphenyldimethoxysilane, trimethylmethoxysilane, tri-n-butylethoxysilane, 3-mercaptopropyltrimethoxysilane, 3-acryoyloxypropyltrimethoxysilane, 3-methylacryloyloxypropyltrimethoxysilane, and 3-methylacryloyloxypropyltriethoxysilane. The aforesaid examples of the silane monomer represented by formula (I-1) can be used alone or as a mixture of two or more.

Preferably, the silane monomer component also includes a siloxane prepolymer of Formula (I-2):

wherein $R^g$, $R^h$, $R^i$ and $R^j$ independently represent a hydrogen atom, a substituted or unsubstituted $C_1$-$C_{10}$ alkyl group, a substituted or unsubstituted $C_2$-$C_6$ alkenyl group, or a substituted or unsubstituted $C_6$-$C_{15}$ aryl group. The plural $R^g$s can be identical with or different from each other and the plural $R^h$s can be identical with or different from each other when s ranges from 2 to 1,000. Examples of the alkyl group include, but are not limited to, methyl, ethyl, and n-propyl. Examples of the alkenyl group include, but are not limited to, vinyl, acryloxypropyl, and methacryloxypropyl. Examples of the aryl group include, but are not limited to, phenyl, tolyl, and naphthyl.

$R^j$ and $R^k$ independently represent a hydrogen atom, a substituted or unsubstituted $C_1$-$C_6$ alkyl group, a substituted or unsubstituted $C_1$-$C_6$ acyl group, or a substituted or unsubstituted $C_6$-$C_{15}$ aryl group. Examples of the alkyl group include, but are not limited to, methyl, ethyl, n-propyl, isopropyl, and n-butyl. A non-limiting example of the acyl group is acetyl. A non-limiting example of the aryl group is phenyl.

In Formula (I-2), s is an integer ranging from 1 to 1,000, preferably from 3 to 300, and more preferably from 5 to 200.

Examples of the siloxane prepolymer represented by formula (I-2) include, but are not limited to, 1,1,3,3-tetramethyl-1,3-dimethoxy disiloxane, 1,1,3,3-tetramethyl-1,3-diethoxydisiloxane, 1,1,3,3-tetraethyl-1,3-diethoxydisiloxane, and commercially available silanol terminal polysiloxanes manufactured by Gelest Inc. (for example, DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight: 26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400), and the like). The aforesaid examples of the siloxane prepolymer can be used alone or as a mixture of two or more.

Preferably, the silane monomer component also includes silicon dioxide particles. There is no specific limitation to the mean particle size of the silicon dioxide particles. The mean particle size of the silicon dioxide particles ranges generally from 2 nm to 250 nm, preferably from 5 nm to 200 nm, and more preferably from 10 nm to 100 nm.

Examples of the silicon dioxide particles include, but are not limited to, commercially available products manufactured by JGC Catalysts and Chemicals Ltd., for example, OSCAR 1132 (particle size: 12 nm, dispersant: methanol), OSCAR 1332 (particle size: 12 nm, dispersant: n-propanol), OSCAR 105 (particle size: 60 nm, dispersant: γ-butyrolactone), OSCAR 106 (particle size: 120 nm, dispersant: diacetone alcohol), and the like; commercially available products manufactured by Fuso Chemical Co., Ltd., for example, Quartron PL-1-IPA (particle size: 13 nm, dispersant: isopropanone), Quartron PL-1-TOL (particle size: 13 nm, dispersant: toluene), Quartron PL-2L-PGME (particle size: 18 nm, dispersant: propylene glycol monomethyl ether), Quartron PL-2L-MEK (particle size: 18 nm, dispersant: methyl ethyl ketone), and the like; and commercially available products manufactured by Nissan Chemical, for example, IPA-ST (particle size: 12 nm, dispersant: isopropanol), EG-ST (particle size: 12 nm, dispersant: ethylene glycol), IPA-ST-L (particle size: 45 nm, dispersant: isopropanol), IPA-ST-ZL (particle size: 100 nm, dispersant: isopropanol), and the like. The aforesaid examples of the silicon dioxide particles can be used alone or as a mixture of two or more.

The condensation can be conducted in a manner well known in the art. For example, a solvent, water, and optionally a catalyst are added to the silane monomer component, followed by stirring at a temperature ranging from 50° C. to 150° C. for 0.5 hour to 120 hours. During stirring, the by-products, such as alcohols, water, and the like, can be removed by distillation, if necessary.

There is no specific limitation to the solvent, which can be identical with or different from the solvent (D) contained in the photosensitive polysiloxane composition. Preferably, the solvent is used in an amount ranging from 15 g to 1,200 g, preferably from 20 g to 1,100 g, and more preferably from 30 g to 1,000 g based on 100 g of the silane monomer component.

The amount of water for the hydrolysis ranges from 0.5 mole to 2 moles based on 1 mole of the hydrolyzable groups contained in the silane monomer component.

There is no specific limitation to the catalyst, and an acid catalyst or a base catalyst can be preferably used. Examples of the acid catalyst include, but are not limited to, hydrochloric acid, nitric acid, sulfuric acid, hydrofluoric acid, oxalic acid, phosphoric acid, acetic acid, trifluoroacetic acid, formic acid, polycarboxylic acids and anhydrides thereof, and ion exchange resins. Examples of the base catalyst include, but are not limited to, diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilanes containing an amino group, and ion exchange resins.

Preferably, the catalyst is used in an amount ranging generally from 0.005 g to 15 g, preferably from 0.01 g to 12 g, and more preferably from 0.05 g to 10 g based on 100 g of the silane monomer component.

In view of storage stability, it is preferable that the by-products (for example, alcohols and water) and the catalyst are not contained in the polysiloxane (A) produced after condensation. Therefore, it is preferable to purify the polysiloxane (A). There is no specific limitation to the purification method. Preferably, the polysiloxane (A) is diluted with a hydrophobic solvent, and an organic layer washed with water several times is then concentrated with an evaporator to remove alcohols or water. Additionally, the catalyst can be removed using ion exchange resin.

Quinonediazidesulfonic Acid Ester (B):

There is no specific limitation to the quinonediazidesulfonic acid ester (B) suitable in the photosensitive polysiloxane composition of the present invention. The quinonediazidesulfonic acid ester (B) can be a fully or partially esterified compound. Preferably, the quinonediazidesulfonic acid ester (B) is obtained via a reaction of o-naphthoquinonediazidesulfonic acid or salt thereof with a hydroxyl compound. More preferably, the quinonediazidesulfonic acid ester (B) is obtained via a reaction of o-naphthoquinonediazidesulfonic acid or salt thereof with a polyhydroxyl compound.

Examples of the o-naphthoquinonediazidesulfonic acid include, but are not limited to, o-naphthoquinonediazide-4-sulfonic acid, o-naphthoquinonediazide-5-sulfonic acid, and o-naphthoquinonediazide-6-sulfonic acid. A non-limiting example of the salt of o-naphthoquinonediazidesulfonic acid is halide of o-naphthoquinonediazidesulfonic acid.

Examples of the hydroxyl compound include, but are not limited to:

(1)hydroxybenzophenone compounds, for example, but not limited to, 2,3,4-trihydroxybenzophenone, 2,4,4'-trihydroxybenzophenone, 2,4,6-trihydroxybenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,5,3',5'-pentahydroxybenzophenone, and 2,3,4,3',4',5'-hexahydroxybenzophenone.

(2) hydroxyaryl compounds, for example, but not limited to, a hydroxyaryl compound represented by Formula (a):

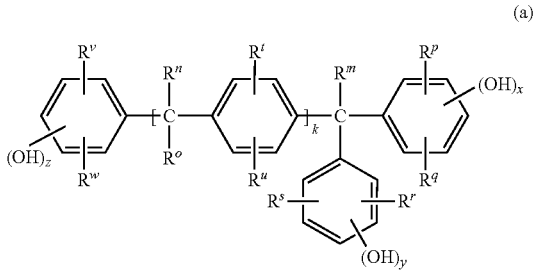

wherein $R^m$, $R^n$, and $R^o$ independently represent a hydrogen atom or a $C_1$-$C_6$ alkyl group;

$R^p$, $R^q$, $R^r$, $R^s$, $R^t$, and $R^u$ independently represent a hydrogen atom, a halogen atom, a $C_1$-$C_6$ alkyl group, a $C_1$-$C_6$ alkoxy group, a $C_1$-$C_6$ alkenyl group, or a cycloalkyl group;

$R^v$ and $R^w$ independently represent a hydrogen atom, a halogen atom, or a $C_1$-$C_6$ alkyl group;

x, y, and z independently denote an integer ranging from 1 to 3;

and k is 0 or 1.

Examples of the hydroxyaryl compound represented by Formula (a) include, but are not limited to, tri(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenyl methane, bis(4-hydroxyphenyl)-3-methoxy-4-hydroxyphenylmethane, bis (3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene.

(3) (hydroxyphenyl)hydrocarbon compounds, for example, but not limited to, a (hydroxyphenyl)hydrocarbon compound represented by Formula (b):

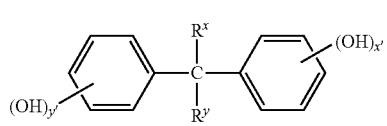

wherein $R^x$ and $R^y$ independently represent a hydrogen atom or a $C_1$-$C_6$ alkyl group;

and x' and y' independently represent an integer ranging from 1 to 3.

Examples of the (hydroxyphenyl)hydrocarbon compound represented by Formula (b) include, but are not limited to, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, and bis(2,4-dihydroxyphenyl)methane.

(4) other aromatic hydroxyl compounds, for example, but not limited to, phenol, p-methoxyphenol, dimethylphenol, hydroquinone, bisphenol A, naphthol, pyrocatechol, pyrogallol monomethyl ether, pyrogallol-1,3-dimethyl ether, gallic acid, and partially esterified or partially etherified gallic acid.

The aforesaid examples of the hydroxyl compounds can be used alone or as a mixture of two or more.

The preferred examples of the hydroxyl compounds include 1-[1-(4-hydroxyphenyl)isopropyl]-4-[1,1-bis(4-hydroxyphenyl)ethyl]benzene, 2,3,4-trihydroxybenzophenone, 2,3,4,4'-tetrahydroxybenzophenone, and combinations thereof.

The reaction of o-naphthoquinonediazidesulfonic acid or salt thereof with the hydroxyl compound is often conducted in an organic solvent such as dioxane, N-pyrrolidone, acetamide, and the like, in the presence of an alkali condensation agent such as triethanolamine, alkali carbonate, alkali hydrogen carbonate, and the like.

Preferably, the esterification rate of the quinonediazidesulfonic acid ester (B) is more than 50%. That is, more than 50% by mole of the hydroxyl group contained in the hydroxyl compound undergoes an esterification reaction with o-naphthoquinonediazidesulfonic acid or salt thereof, based on 100% by mole of the total hydroxyl group contained in the hydroxyl compound. More preferably, the esterification rate of the quinonediazide sulfonate compound is more than 60%.

The quinonediazidesulfonic acid ester (B) is used in an amount ranging from 0.5 part by weight to 50 parts by weight, preferably from 2 parts by weight to 40 parts by weight, and more preferably from 3 parts by weight to 30 parts by weight based on 100 parts by weight of the polysiloxane (A).

Pyridine Derivative (C):

The pyridine derivative (C) is represented by Formula (II):

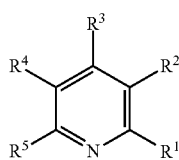

wherein one to three of $R^1$-$R^5$ independently represent a hydroxyl-substituted $C_1$-$C_6$ alkyl group, and the rest of $R_1$-$R_5$ independently represent hydrogen or a $C_1$-$C_6$ alkyl group.

The polysiloxane composition has inferior development resistance when the pyridine derivative (C) is not used. The polysiloxane composition of the present invention has superior tolerance for developer and therefore has superior development resistance by using a combination of the polysiloxane (A) and the pyridine derivative (C) therein.

Examples of the pyridine derivative (C) include, but are not limited to, 2-hydroxymethylpyridine, 3-hydroxymethylpyridine, 4-hydroxymethylpyridine, 2-hydroxyethylpyridine, 3-hydroxyethylpyridine, 4-hydroxyethylpyridine, 2-hydroxypropylpyridine, 3-hydroxypropylpyridine, 4-hydroxypropylpyridine, 2,6-dihydroxymethylpyridine, and combinations thereof.

Preferably, the pyridine derivative (C) is selected from 4-hydroxymethylpyridine, 2-hydroxyethylpyridine, 3-hydroxypropylpyridine, 2,6-dihydroxymethylpyridine, and combinations thereof.

The pyridine derivative (C) of Formula (II) is used in an amount ranging from 0.1 part by weight to 20 parts by weight, preferably from 0.5 part by weight to 18 parts by weight, and more preferably from 1 part by weight to 15 parts by weight based on 100 parts by weight of the polysiloxane (A).

Solvent (D):

There is no specific limitation to the solvent (D) suitable in the photosensitive polysiloxane composition of the present invention. Examples of the solvent (D) include, but are not limited to, an alcoholic hydroxyl-containing compound, and a carbonyl-containing cyclic compound. The aforesaid examples of solvent (D) can be used alone or as a mixture of two or more.

Examples of the alcoholic hydroxyl-containing compound include, but are not limited to, acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol, abbreviated as DAA), ethyl lactate, butyl lactate, propylene glycol monomethyl ether, propylene glycol monoethyl ether (abbreviated as PGEE), propylene glycol monomethylether acetate (abbreviated as PGMEA), propylene glycol mono-n-propyl ether, propylene glycol mono-n-butyl ether, propylene glycol mono-t-butyl ether, 3-methoxy-1-butanol, 3-methyl-3-methoxy-1-butanol, and combinations thereof. The aforesaid examples of the alcoholic hydroxyl-containing compound can be used alone or as a mixture of two or more.

Preferably, the alcoholic hydroxyl-containing compound is selected from diacetone alcohol, ethyl lactate, propylene glycol monoethyl ether, propylene glycol monomethylether acetate, and combinations thereof.

Examples of the carbonyl-containing cyclic compound include, but are not limited to, γ-butyrolactone, γ-valerolactone, δ-valerolactone, propylene carbonate, N-methylpyrrolidone, cyclohexanone, and cycloheptanone. The aforesaid examples of the carbonyl-containing cyclic compound can be used alone or as a mixture of two or more.

Preferably, the carbonyl-containing cyclic compound is selected from γ-butyrolactone, N-methylpyrrolidone, cyclohexanone, and combinations thereof.

When the alcoholic hydroxyl-containing compound and the carbonyl-containing cyclic compound are used in combination, there is no specific limitation to the weight ratio thereof. The weight ratio of the alcoholic hydroxyl-containing compound to the carbonyl-containing cyclic compound ranges preferably from 99/1 to 50/50, and more preferably from 95/5 to 60/40. It should be noted that, when the weight ratio of the alcoholic hydroxyl-containing compound to the carbonyl-containing cyclic compound ranges from 99/1 to 50/50, it is less likely for the unreactive silanol group in the polysiloxane (A) to undergo condensation reaction that may reduce the storage stability. Moreover, the miscibility between the polysiloxane (A) and the quinonediazidesulfonic acid ester (B) is good so that it is less likely to opaque the protective film, thereby maintaining the transparency of the protective film formed thereby.

Further solvents other than the aforesaid solvent can be included in the photosensitive polysiloxane composition of the present invention as long as the desirable effects obtainable by the photosensitive polysiloxane composition are not impaired. Examples of the further solvents include, but are not limited to: (1) esters, for example, ethyl acetate, n-propyl acetate, isopropyl acetate, n-butyl acetate, isobutyl acetate, propylene glycol monomethyl ether acetate, 3-methoxy-1-butyl acetate, 3-methyl-3-methoxy-1-butyl acetate, and the like; (2) ketones, for example, methyl isobutyl ketone, diisopropyl ketone, diisobutyl ketone, and the like; (3) ethers, for example, diethyl ether, diisopropyl ether, di-n-butyl ether, diphenyl ether, and the like.

The solvent (D) is used in an amount ranging generally from 50 parts by weight to 1,200 parts by weight, preferably from 80 parts by weight to 1,000 parts by weight, and more preferably from 100 parts by weight to 800 parts by weight based on 100 parts by weight of polysiloxane (A).

Additives (E):

Additives (E) can be optionally added to the photosensitive polysiloxane composition, and include, but are not limited to, a sensitizer, an adhesion auxiliary agent, a surfactant, a solubility promoter, a defoamer, and combinations thereof.

There is no specific limitation to the sensitizer. Preferably, the sensitizer is a phenolic hydroxyl-containing compound, for example, but not limited to: (1) trisphenol type compounds, for example, tri(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-methylphenyl)-2-hydroxyphenylmethane, bis(4-hydroxy-2,5-dimethylphenyl)-4-hydroxyphenyl methane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenyl methane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, bis (5-cyclohexyl-4-hydroxy-2-methylphenyl)-3,4-dihydroxyphenylmethane, and the like; (2) bisphenol type compounds, for example, bis(2,3,4-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, 2-(2,3,4-trihydroxyphenyl)-2-(4'-hydroxy-3',5'-dimethylphenyl)propane, and the like; (3) polynuclear branched compounds, for example, 1-[1-(4-hydroxyphenyl)isopropyl]-4-[1,1-bis(4-hydroxyphenyl)ethyl]benzene, 1-[1-(3-methyl-4-hydroxyphenyl]isopropyl]-4-[1,1-bis(3-methyl-4-hydroxyphenyl)ethyl]benzene, and the like; (4) condensation type phenol compounds, for example, 1,1-bis(4-hydroxyphenyl)cyclohexane, and the like; (5) polyhydroxy benzophenones, for example, 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, 2,3,4,3',4',5'-hexahydroxybenzophenone, and the like; and (6) combinations thereof.

The sensitizer is used in an amount ranging preferably from 5 to 50 parts by weight, more preferably from 8 to 40 parts by weight, and most preferably from 10 to 35 parts by weight based on 100 parts by weight of the polysiloxane (A).

The adhesion auxiliary agent is used to enhance the adhesion of the photosensitive polysiloxane composition of the present invention to a substrate containing a semiconductor material. Examples of the adhesion auxiliary agent include, but are not limited to, melamine compounds and silane compounds. Examples of the commercially available products of the melamine compounds include, but are not limited to, Cymel-300, Cymel-303, and the like manufactured by Mitsui Chemicals; and MW-30MH, MW-30, MS-11, MS-001, MX-750, MX-706, and the like manufactured by Sanwa Chemical. Examples of the silane compounds include, but are not limited to, vinyltrimethoxysilane, vinyltriethoxysilane, 3-acryloxypropyltrimethoxy silane, vinyltri(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropyldimethylmethoxysilane, 2-(3,4-epoxycyclohexyl)ethyltrimethoxysilane, 3-chloropropylmethyldimethoxysilane, 3-chloropropyltrimethoxysilane, 3-methylallyloxypropyltrimethoxysilane, 3-mercaptopropyltrimethoxysilane, and commercially available products manufactured by Shin-Etsu Chemical Co., Ltd. (for example, KMB403).

The melamine compounds used as the adhesion auxiliary agent are in an amount ranging preferably from 0 to 20 parts by weight, more preferably from 0.5 part by weight to 18 parts by weight, and most preferably from 1.0 part by weight to 15 parts by weight based on 100 parts by weight of the polysiloxane (A).

The silane compounds used as the adhesion auxiliary agent are in an amount ranging preferably from 0 to 2 parts by weight, more preferably from 0.05 part by weight to 1 part by weight, and most preferably from 0.1 part by weight to 0.8 part by weight based on 100 parts by weight of the polysiloxane (A).

Examples of the surfactant include, but are not limited to, anionic surfactant, cationic surfactant, nonionic surfactant, amphoteric surfactant, polysiloxane surfactant, fluorinated surfactant, and combinations thereof. Examples of the surfactant include, but are not limited to: (1) polyoxyethylene alkyl ethers, for example, polyoxyethylene lauryl ether, and the like; (2) polyoxyethylene alkyl phenyl ethers, for example, polyoxyethylene octyl phenyl ether, polyoxyethylene nonyl phenyl ether, and the like; (3) polyethylene glycol diesters, for example, polyethylene glycol dilaurate, polyethylene glycol distearate, and the like; (4) sorbitan fatty acid esters; (5) fatty acid modified polyesters; (6) tertiary amine modified polyurethanes, and the like. Examples of commercially available products of the surfactant include KP (manufacture by Shin-Etsu Chemical Co., Ltd.), SF-8427 (manufactured by Toray Dow Corning Silicone), Polyflow (manufactured by Kyoeisha Chemical Co., Ltd.), F-Top (manufactured by Tochem Product Co., Ltd.), Megaface (manufactured by DIC), Fluorade (manufactured by Sumitomo 3M), Surflon (manufactured by Asahi Glass), SINOPOL E8008 (manufactured by Sino-Japan Chemical Co., Ltd.), F-475 (manufactured by DIC), and combinations thereof.

The surfactant is used in an amount ranging from 0.5 part by weight to 50 parts by weight, preferably from 1 part by weight to 40 parts by weight, and more preferably from 3 parts by weight to 30 parts by weight based on 100 parts by weight of the polysiloxane (A).

Examples of the defoamer include, but are not limited to, Surfynol MD-20, Surfynol MD-30, EnviroGem AD01, EnviroGem AE01, EnviroGem AE02, Surfynol DF 110D, Surfynol 104E, Surfynol 420, Surfynol DF 37, Surfynol DF 58, Surfynol DF 66, Surfynol DF 70, and Surfynol DF 210 (manufactured by Air products).

The defoamer is used in an amount ranging preferably from 1 part to 10 parts by weight, more preferably from 2 parts to 9 parts by weight, and most preferably from 3 parts to 8 parts by weight based on 100 parts by weight of the polysiloxane (A).

Examples of the solubility promoter include, but are not limited to, N-hydroxydicarboxylic imide compounds, and phenolic hydroxyl compounds, for example, the hydroxyl compounds used for manufacturing the quinonediazidesulfonic acid ester (B).

The solubility promoter is used in an amount ranging preferably from 1 part by weight to 20 parts by weight, more preferably from 2 parts by weight to 15 parts by weight, and most preferably from 3 parts by weight to 10 parts by weight based on 100 parts by weight of the polysiloxane (A).

The photosensitive polysiloxane composition of the present invention is manufactured by stirring the polysiloxane (A), the quinonediazidesulfonic acid ester (B), the pyridine derivative (C) of Formula (II), and the solvent (D) optionally together with the additives (E) in a stirrer to form a homogeneous solution.

A protective film of the present invention is formed by coating the photosensitive polysiloxane composition onto a substrate followed by pre-bake, exposure, development, and post-bake treatments.

The photosensitive polysiloxane composition is applied on the substrate by spin coating, slit coating, roller coating, or the like, and is then prebaked to remove the solvent and to form a prebaked coating film. The conditions for the prebaking depend on the types and the formulating ratio of the components for the photosensitive polysiloxane composition. However, the prebaking is usually conducted at a temperature ranging from 70° C. to 110° C. for a period ranging from 1 minute to 15 minutes. The prebaked coating film is exposed via a photomask using ultraviolet light, such as g-line, h-line, i-line, or the like. The device for providing the ultraviolet light includes a (ultra-) high pressure mercury lamp, and a metal halide lamp. The prebaked coating film after exposing is immersed in a developer solution at a temperature of 23±2° C. for a period ranging from 15 seconds to 5 minutes so as to form a desired pattern. Examples of the developer include alkali compounds, such as sodium hydroxide, potassium hydroxide, sodium carbonate, sodium hydrogen carbonate, potassium carbonate, potassium hydrogen carbonate, sodium silicate, sodium methylsilicate, aqueous ammonia, ethylamine, diethylamine, dimethyl ethanolamine, tetramethylammonium hydroxide (abbreviated as TMAH), tetraethylammonium hydroxide, choline, pyrrole, piperidine, 1,8-diazabicyclo-[5,4,0]-7-undecene, and the like.

The developer solution is used to reveal defined patterns after exposing the photosensitive polysiloxane composition. When the concentration of the developer solution is too high, the specific pasterns will be damaged or have deteriorated resolution. When the concentration of the developer solution is too low, the specific patterns will not be formed or residue after developing may be formed due to poor development. The concentration of the developer solution will influence the patterns formed by the photosensitive polysiloxane composition after exposure. Preferably, the developer solution is used in a concentration ranging preferably from 0.001 wt % to 10 wt %, more preferably from 0.005 wt % to 5 wt %, and even more preferably from 0.01 wt % to 1 wt %. In the illustrative examples of this invention, 2.38 wt % of tetramethylammonium hydroxide was used as the developer solution. The developer solution of 2.38 wt % is commonly used in the art while the developer solution less than 2.38 wt % can be used, if required. The developer solution of 2.38 wt % can be used for developing the photosensitive polysiloxane composition in this invention. The photosensitive polysiloxane composition is capable of forming fine patterns even when a developer solution less than 2.38 wt % is used.

The developer solution is removed by washing with water after developing. The coating film formed on the substrate is dried with compressed air or nitrogen, and is then post-baked using a heating device, such as a hot plate or an oven. The post-baking is conducted at a temperature ranging from 100° C. to 250° C. for a period ranging from 1 minute to 60 minutes if the hot plate is used or for a period ranging from 5 minutes to 90 minutes if the oven is used. A protective film is formed on the substrate after the aforementioned process.

Examples of the substrate suitable for the present invention include alkali-free glass, soda-lime glass, Pyrex glass, quartz glass, a glass coated with a transparent conductive film thereon, and the like commonly used in a liquid crystal display; and a photoelectric conversion substrate (for example, a silicon substrate) used in a solid-state image sensor.

An element including the substrate and the protective film formed from the photosensitive polysiloxane composition of the present invention applied on the substrate can be used in a display device, a semiconductor device, an optical waveguide device, and the like.

The following examples are provided to illustrate the preferred embodiments of the invention, and should not be construed as limiting the scope of the invention.

EXAMPLES

Preparation of Polysiloxane (A)

Preparation Example A-1

A 500 ml three-necked flask was added with methyltrimethoxysilane (referred to as MTMS, 0.3 mole), phenyltrimethoxysilane (referred to as PTMS, 0.65 mole), 3-(triethoxysilyl) propyl succinic anhydride (referred to as GF-20, 0.05 mole), and propylene glycol monoethyl ether (referred to as PGEE, 200 g). Stirring was conducted at room temperature while an aqueous oxalic acid solution (0.40 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes. When the temperature of the mixture in the flask reached 105° C., the mixture in the flask was stirred for a further 6 hours to carry out polycondensation reaction. The polysiloxane (A-1) was obtained after distillation to remove the solvent. The types and the amounts of the chemicals used in Preparation Example A-1 are listed in Table 1.

Preparation Example A-2

A 500 ml three-necked flask was added with dimethyldimethoxysilane (referred to as DMDMS, 0.40 mole), PTMS (0.40 mole), phenyltriethoxysilane (referred to as PTES, 0.20 mole), PGEE (100 g), and diacetone alcohol (referred to as DAA, 100 g). Stirring was conducted at room temperature while an aqueous oxalic acid solution (0.40 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes. When the temperature of the mixture in the flask reached 110° C., the mixture in the flask was stirred for a further 5 hours to carry out polycondensation reaction. The polysiloxane (A-2) was obtained after distillation to remove the solvent. The types and the amounts of the chemicals used in Preparation Example A-2 are listed in Table 1.

Preparation Example A-3

A 500 ml three-necked flask was added with DMDMS (0.60 mole), PTMS (0.35 mole), 3-(trimethoxysilyl)propyl-glutaric anhydride (referred to as TMSG, 0.05 mole), and PGEE (200 g). Stirring was conducted at room temperature while an aqueous oxalic acid solution (0.35 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes. When the temperature of the mixture in the flask reached 105° C., the mixture in the flask was stirred for a further 6 hours to carry out polycondensation reaction to form the polysiloxane (A-3). The types and the amounts of the chemicals used in Preparation Example A-3 are listed in Table 1.

Preparation Example A-4

A 500 ml three-necked flask was added with MTMS (0.65 mole), PTES (0.25 mole), 2-oxetanylbutoxypropyltrimethoxysilane (referred to as TMSOX-D, 0.09 mole), silanol terminal polysiloxane (commercially available as DMS-S27 manufactured by Gelest Inc., 0.01 mole), and PGEE (200 g). Stirring was conducted at room temperature while an aqueous oxalic acid solution (0.45 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes. When the temperature of the mixture in the flask reached 110° C., the mixture in the flask was stirred for a further 6 hours to carry out polycondensation reaction. The polysiloxane (A-4) was obtained after distillation to remove the solvent. The types and the amounts of the chemicals used in Preparation Example A-4 are listed in Table 1.

TABLE 1

| | Compositions | | | | | | | | | | | | | |
|---|---|---|---|---|---|---|---|---|---|---|---|---|---|---|
| | Silane monomers/Siloxane Prepolymers (moles) | | | | | | | | Solvents (g) | | Catalysts (g) | | React. | Polycondensation |
| Prep. Ex. | MTMS | DMDMS | PTMS | PTES | GF-20 | TMSG | TMSOX-D | DMS-27 | PGEE | DAA | Water | Oxalic Acid | Temp. (° C.) | Time (hrs) |
| A-1 | 0.30 | — | 0.65 | — | 0.05 | — | — | — | 200 | — | 75 | 0.40 | 105 | 6 |
| A-2 | — | 0.40 | 0.40 | 0.20 | — | — | — | — | 100 | 100 | 75 | 0.40 | 110 | 5 |
| A-3 | — | 0.60 | 0.35 | — | — | 0.05 | — | — | 200 | — | 75 | 0.35 | 105 | 6 |
| A-4 | 0.65 | — | — | 0.25 | — | — | 0.09 | 0.01 | 200 | — | 75 | 0.45 | 110 | 6 |

| Abbreviation | Chemicals | Molecular Weight |
|---|---|---|
| MTMS | methyl trimethoxy silane | 136 |
| DMDMS | dimethyl dimethoxy silane | 120 |
| PTMS | phenyl trimethoxy silane | 198 |
| PTES | phenyl triethoxy silane | 240 |
| GF-20 | 3-(triethoxysilyl) propyl succinic anhydride | 304 |
| TMSG | 3-(trimethoxysilyl) propyl glutaric anhydride | 276 |
| TMSOX-D | 2-oxetanylbutoxypropyl-trimethoxysilane | 278 |
| DMS-S27 | silanol terminal polysiloxanes manufactured by Gelest Inc. | 18000 |
| PGEE | propylene glycol monoethyl ether | 104 |
| DAA | diacetone alcohol | 116 |

Preparation of Photosensitive Polysiloxane Composition

Example 1

100 parts by weight of the polysiloxane (A-1) obtained in Preparation Example A-1, 10 parts by weight of an o-naphthoquinonediazidesulfonic acid ester compound (DPAP200 manufactured by DKC, average esterification rate: 67%) obtained by reacting 1-[1-(4-hydroxyphenyl)isopropyl]-4-[1,1-bis(4-hydroxyphenyl)ethyl]benzene with o-naphthoquinonediazo-5-sulfonic acid, and 0.1 part by weight of 4-hydroxymethylpyridine were added into 50 parts by weight of PGMEA. Stirring was conducted using a shaking type stirrer until a homogenous photosensitive polysiloxane composition was obtained. The obtained photosensitive polysiloxane composition was evaluated according to the following evaluation methods. The evaluation results are shown in Table 2.

Examples 2 to 8 and Comparative Examples 1 and 2

Examples 2 to 8 and Comparative Examples 1 and 2 were conducted in a manner identical to that of Example 1 using the components and the amounts thereof shown in Table 2. The obtained photosensitive polysiloxane compositions of Examples 2 to 8 and Comparative Examples 1 and 2 were evaluated according to the following evaluation methods. The evaluation results are shown in Table 2.

Evaluation Methods:

Development Resistance:

The photosensitive polysiloxane compositions obtained in Examples 1 to 8 and Comparative Examples 1 and 2 were separately spin-coated on glass substrates of 100 mm×100 mm×0.7 mm to obtain pre-coated films of 2 μm in thickness followed by pre-baking at 110° C. for 2 minutes. The pre-coated films were then treated with ultra-violet irradiation using an exposure machine (100 mJ/cm$^2$) through suitable positive photo-masks, and were then immersed in a developer solution of 2.38 wt % TMAH at 23° C. for 100 seconds to obtain 100 cylinder patterns with 10 nm in diameter. The evaluation criteria are defined as follows and the evaluation results are listed in Table 2.

○: less than 10 cylinders were damaged;
X: 10 or more cylinders were damaged.

TABLE 2

| Components (parts by weight) | | Examples | | | | | | | | Com. Ex. s | |
|---|---|---|---|---|---|---|---|---|---|---|---|
| | | 1 | 2 | 3 | 4 | 5 | 6 | 7 | 8 | 1 | 2 |
| Polysiloxane(A) | A-1 | 100 | — | — | — | — | 50 | — | — | 100 | — |
| | A-2 | — | 100 | — | — | — | — | 100 | — | — | 100 |
| | A-3 | — | — | 100 | — | 100 | 50 | — | 70 | — | — |
| | A-4 | — | — | — | 100 | — | — | — | 30 | — | — |
| quinonediazidesulfonic acid ester(B) | B-1 | 10 | — | 20 | 20 | — | 10 | — | 0.5 | 15 | — |
| | B-2 | — | 15 | — | 5 | 50 | — | 10 | — | — | 15 |
| pyridine derivative (C) | C-1 | 0.1 | — | — | — | — | — | 5 | — | — | — |
| | C-2 | — | 1 | — | — | — | 20 | — | 3 | — | — |
| | C-3 | — | — | 5 | — | 15 | — | 5 | — | — | — |
| | C-4 | — | — | — | 10 | — | — | — | 2 | — | — |
| Solvents(D) | D-1 | 50 | — | 500 | — | 500 | 1000 | 200 | 500 | 500 | 500 |
| | D-2 | — | 300 | — | 500 | — | — | 300 | — | — | — |
| | D-3 | — | — | — | 100 | — | 200 | — | — | — | — |
| Additives(E) | E-1 | — | 3 | — | — | — | — | — | — | — | — |
| | E-2 | — | — | — | 1 | — | — | — | — | — | — |

TABLE 2-continued

| Components | | Examples | | | | | | | | Com. Ex. s | |
|---|---|---|---|---|---|---|---|---|---|---|---|
| (parts by weight) | | 1 | 2 | 3 | 4 | 5 | 6 | 7 | 8 | 1 | 2 |
| Evaluation Items | Dev. Resistance | ○ | ○ | ○ | ○ | ○ | ○ | ○ | ○ | X | X |

B-1: o-naphthoquinonediazidesulfonic acid ester compound obtained by reacting 1-[1-(4-hydroxyphenyl)isopropyl]-4-[1,1-bis(4-hydroxyphenyl)ethyl]benzene with o-naphthoquinonediazo-5-sulfonic acid;
B-2: o-naphthoquinonediazidesulfonic acid ester compound obtained by reacting 2,3,4-trihydroxybenzophenone with o-naphthoquinonediazo-5-sulfonic acid;
C-1: 4-hydroxymethylpyridine;
C-2: 2-hydroxyethylpyridine;
C-3: 3-hydroxypropylpyridine;
C-4: 2,6-dihydroxymethylpyridine;
D-1: propylene glycol monomethylether acetate (abbreviated as PGMEA);
D-2: diacetone alcohol (abbreviated as DAA);
D-3: cyclohexanone;
E-1 (surfactant): SF-8427 (manufactured by Toray Dow Corning Silicon);
E-2 (adhesion auxiliary agent): 3-glycidoxypropyltrimethoxysilane (commercially available as KBM403 manufactured by Shin-Etsu Chemical Co., Ltd.).

As shown in Table 2, the polysiloxane compositions in Comparative Examples 1 and 2 respectively use polysiloxane (A-1) having acid value and polysiloxane (A-2) having no acid value, both without being added with the pyridine derivative (C). The physical properties of the polysiloxane compositions will change with length of storage period which leads to formation of the protective films having inferior development resistance. The polysiloxane compositions in Examples 1 to 8 all contain pyridine derivative (C) of formula (II). The physical properties of the polysiloxane compositions will not change with length of storage period, and the protective films thus formed have superior development resistance regardless of whether the polysiloxanes (A) have acid value or not.

In view of the aforesaid, the protective film in this invention formed from the photosensitive polysiloxane composition has superior development resistance through use of the aromatic ring-containing pyridine derivative (C).

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A photo-sensitive polysiloxane composition, comprising:
a polysiloxane;
a quinonediazidesulfonic acid ester;
a pyridine derivative of Formula (II)

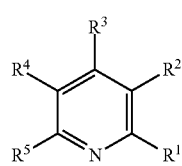

(II)

wherein
one to three of $R^1$-$R^5$ independently represent a hydroxyl-substituted $C_1$-$C_6$ alkyl group, and the rest of $R_1$-$R_5$ independently represent hydrogen or a $C_1$-$C_6$ alkyl group; and a solvent,
wherein said polysiloxane is obtained by subjecting a silane monomer component to hydrolysis and partial condensation, said silane monomer component including a silane monomer of Formula (I):

$$Si(R^a)_t(OR^b)_{4-t} \qquad (I)$$

wherein
t is an integer ranging from 1 to 3,
at least one of $R^a$ is selected from the group consisting of an anhydride-substituted $C_1$-$C_{10}$ alkyl group, an epoxy-substituted $C_1$-$C_{10}$ alkyl group, and an epoxy-substituted alkoxy group, and the rest of $R^a$ is selected from the group consisting of hydrogen, a $C_1$-$C_{10}$ alkyl group, a $C_2$-$C_{10}$ alkenyl group, and a $C_6$-$C_{15}$ aryl group, plural $R^a$s being identical with or different from each other when t is 2 or 3, and
$R^b$ is selected from the group consisting of a hydrogen atom, a $C_1$-$C_6$ alkyl group, a $C_1$-$C_6$ acyl group, and a $C_6$-$C_{15}$ aryl group, plural $R^b$s being identical with or different from each other when 4-t is 2 or 3.

2. The photo-sensitive polysiloxane composition as claimed in claim 1, wherein said pyridine derivative is selected from the group consisting of 2-hydroxymethyl pyridine, 3-hydroxymethyl pyridine, 4-hydroxymethyl pyridine, 2-hydroxyethyl pyridine, 3-hydroxyethyl pyridine, 4-hydroxyethyl pyridine, 2-hydroxypropyl pyridine, 3-hydroxypropyl pyridine, 4-hydroxypropyl pyridine, 2,6-dihydroxymethyl pyridine, and combinations thereof.

3. The photo-sensitive polysiloxane composition as claimed in claim 1, wherein said quinonediazidesulfonic acid ester is in an amount ranging from 0.5 to 50 parts by weight, said pyridine derivative is in an amount ranging from 0.1 to 20 parts by weight, and said solvent is in an amount ranging from 50 to 1200 parts by weight based on 100 parts by weight of said polysiloxane.

4. A protective film adapted to be formed on a substrate, said protective film being formed by applying the photo-sensitive polysiloxane composition as claimed in claim 1 on the substrate.

5. An element, comprising a substrate, and the protective film as claimed in claim 4 applied on said substrate.

* * * * *